(12) United States Patent
Hoshino

(10) Patent No.: US 6,872,494 B2
(45) Date of Patent: Mar. 29, 2005

(54) PHOTOMASK AND METHOD OF FABRICATING SEMICONDUCTOR DEVICE BY USE OF SAME

(75) Inventor: Daigo Hoshino, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 154 days.

(21) Appl. No.: 10/140,171

(22) Filed: May 8, 2002

(65) Prior Publication Data

US 2002/0172872 A1 Nov. 21, 2002

(30) Foreign Application Priority Data

May 15, 2001 (JP) ........................................ 2001-145218

(51) Int. Cl.[7] .............................................. G03F 9/00
(52) U.S. Cl. ................. 430/5; 430/30; 716/19
(58) Field of Search ..................... 430/5, 30; 716/19–21

(56) References Cited

U.S. PATENT DOCUMENTS

| | | | | |
|---|---|---|---|---|
| 6,114,071 A | * | 9/2000 | Chen et al. ..................... | 430/5 |
| 6,284,415 B1 | * | 9/2001 | Nakasuji ......................... | 430/5 |
| 6,383,691 B1 | * | 5/2002 | Seitz et al. ..................... | 430/5 |
| 6,465,138 B1 | * | 10/2002 | Stanton ......................... | 430/5 |
| 2001/0028981 A1 | * | 10/2001 | Okada et al. .................. | 430/5 |

* cited by examiner

Primary Examiner—Mark F. Huff
Assistant Examiner—Kripa Sagar
(74) Attorney, Agent, or Firm—Rabin & Berdo, P.C.

(57) ABSTRACT

A photomask for use in a semiconductor fabrication process, comprises a plurality of first mask patterns for transferring resist patterns, and second mask patterns for restraining an optical proximity effect, each having a width not larger than a resolution limit. The second mask patterns are formed in a line-like shape, and disposed so as to link together the plurality of first mask patterns. As a result of use of the second mask patterns in the line-like shape, a fewer parameters may be added in simulation of resist patterns. Thus, it becomes possible to provide the photomask for efficiently performing simulation and forming suitable resist patterns. Further, the photomask can be used in a semiconductor fabrication process.

19 Claims, 17 Drawing Sheets

PHOTOMASK AND METHOD OF FABRICATING SEMICONDUCTOR DEVICE BY USE OF SAME

BACKGROUND OF THE INVENTION

1. Field of the Invention

The invention relates to a photomask for use in an exposure step of a semiconductor fabrication process. Also, the invention is concerned with a method of fabricating a semiconductor device, comprising the step of forming resist patterns by executing exposure with the use of the photomask.

2. Description of the Related Art

A photomask is generally obtained by depositing a Cr (chromium) film on predetermined parts of a glass substrate, serving as light shielding parts. Parts of the glass substrate, not covered with the Cr film, serve as light transmitting parts. Exposure light is transmitted through these light transmitting parts or shielded with these light shielding parts, thereby implementing transfer of predetermined mask patterns to a resist or the like as an object for exposure, formed on a semiconductor substrate. After the transfer of the mask patterns to the resist, patterning is executed on the resist, and a semiconductor device is fabricated by use of the resist as patterned.

In the exposure step, the resist is irradiated with light through the photomask after the surface of the semiconductor substrate (also referred to as a wafer at times) is covered with the resist. As a result, a latent image of the mask patterns is formed in the resist. Subsequently, upon the development of the resist, parts of the resist, corresponding to the latent image, are selectively left out or removed, thereby forming resist patterns on the wafer. In the case of pattern fidelity being excellent, the resist patterns are substantially equivalent in shape to the mask patterns. In the exposure step, use is made of a 1× magnification or reduction type projection aligner. In the case of using the reduction-type projection aligner, the size of the respective resist patterns as formed is equivalent to the size of the respective mask patterns, multiplied by a size reduction ratio. In such a case as described, mask pattern designing can be done with ease.

However, along with advance in further microminiaturization of the mask pattern, the influence of an optical proximity effect becomes pronounced, and consequently, the pattern fidelity deteriorates, thereby causing a problem that the resist pattern is found largely deviated from the mask pattern.

Referring to FIG. 13, the optical proximity effect is described simply hereinafter. FIG. 13 is a schematic view showing an exposure system using a typical reduction-type projection aligner. As shown in FIG. 13, the projection aligner comprises an aperture 10, a photomask (referred to at times merely as a mask) 12, and a reduction lens 14. Exposure light emitted from a light source (not shown) is transmitted through the aperture 10, some optical lens between the aperture 10 and the mask 12, the mask 12 and the reduction lens 14 in this order to be irradiated to a wafer 16 with a resist film formed on the surface thereof. The aperture 10 is a light shielding plate having an opening 10a for transmitting light. The mask 12 is a glass substrate 18 with a Cr film 19 deposited at predetermined positions on the surface thereof. When the exposure light passes through the mask 12, there occurs diffraction at light transmitting parts (glass parts), The exposure light after passing through the mask 12 is condensed on the wafer 16 by the agency of the reduction lens 14.

Thus, diffraction occurs at the mask 12. Assuming that respective intervals between line patterns of the mask patterns are designated P, a diffraction angle θ is expressed by expression (1) as follows:

$$P \sin \theta = n\lambda \qquad (1)$$

where λ is the wavelength of exposure light, and n is an order. According to the expression (1), the smaller a value P is, that is, the more the pattern is miniaturized, the greater a diffraction angle θ becomes. Because an optical system such as the reduction lens 14 is of a finite size, and the optical system comes to fail arresting light components of a large diffraction angle θ (higher-order light components), light intensity distribution on the wafer 16 deteriorates as compared with information of the mask patterns. As a result, resist patterns formed on the wafer 16 becomes rounder or comes to recede in the extremities thereof. This represents the optical proximity effect.

FIGS. 14, 15, 16, and 17 show an example of the optical proximity effect, respectively. Respective figures (A) thereof show various types of conventional photomasks, and in the respective figures, crosshatched parts correspond to the light shielding parts of the respective photomasks while hollow parts correspond to the light transmitting parts of the respective photomasks. Respective figures (B) thereof show results of simulating resist patterns in the case of exposure being executed by use of the respective photomasks. In the respective figures (B), image patterns together with the resist patterns obtained by the simulation are shown. The respective image patterns are parameters necessary for performing a simulation, representing the shape and size of the respective mask patterns virtually projected on the surface of a semiconductor substrate. More specifically, the size of the mask pattern on the photomask used in the reduction-type projection aligner is reduced down to the size of the image pattern in the respective figures (B) (for example, the size of a pattern on the mask used in a 1:5 reduction-type projection aligner is five times as large as the size of the pattern shown in the respective figures). Further, a region surrounded by a solid line inside respective hollow parts shows the respective resist patterns obtained by performing the simulation (for easy differentiation, an extension line indicating the resist pattern is provided with an arrow). In the respective figures, a X direction and a Y direction, intersecting each other at right angles, are shown, and in the respective figures showing the results of the simulation, the position of the respective image patterns, along the X direction and Y direction, respectively, is shown on a unit of μm.

The resist may be either a positive resist or a negative resist, and in the case of assuming that the resist is the positive resist, the respective resist patterns shown, particularly, in FIGS. 14(B), 15(B), and 16(B), respectively, correspond to a hole pattern. In the case of assuming that the resist is the negative resist, the respective resist patterns shown, particularly, in FIG. 17(B) correspond to a line pattern. Herein, the results of the simulation performed using primarily the positive resist is described.

Simulation conditions are as follows:
(1) illumination condition: Lens NA/σ=0.60/0.75
(2) the wavelength of exposure light: λ=248 nm (KrF laser ray)
(3) resist: positive resist Lens NA as described above is called a numerical aperture of a reduction lens and is expressed by the following equation (2):

Lens $NA = n \cdot \sin \theta_2$      (2) ($n$:refractive index)

where $\sin \theta_2$ refers to an angle between the direction of propagation of a light ray after passing through the reduction lens 14 in FIG. 13, and the optical axis of the reduction lens 14.

A resolution power increases when lens NA is increased, and a depth of focus (DOF) increases when lens NA is reduced. For causing lens NA to be changed, it is suffice to change the diameter of a light transmitting part by use of an aperture stop of the lens.

Further, σ as described above is a ratio of the entrance pupil to the exit pupil, that is the diameter Ri of the opening (entrance pupil) 10a of the aperture 10 to the diameter Rl of a lens pupil 14a of the reduction lens 14(exit pupil), and is expressed by the following equation (3):

$$\sigma Ri/Rl \quad (3)$$

A pupil corresponds to a scope through which light can pass. The diameter Rl of the lens pupil 14a is proportional to lens NA.

The resolution power, DOF, and a difference in size between an isolated pattern and a nested pattern vary depending on a combination of NA and σ.

In obtaining the results of the simulation, shown in FIG. 14(B) to FIG. 17(B), respectively, use was made of Prolith 2 Ver. 5.07 (tradename) manufactured by FINLE Technologies Company for a simulation tool.

FIG. 14(A) is a schematic illustration showing a conventional photomask 20. The photomask 20 comprises light transmitting parts 22 which are hollow parts, and a light shielding part 24 which is a crosshatched part. In this example, the respective light transmitting parts 22 are designated as a mask pattern. The respective light transmitting parts 22 are in a rectangular shape, and are disposed in a grid format (3 rows×3 columns).

With respective image patterns 26 in a rectangular shape, shown in FIG. 14(B), the length of the longer side (a distance in the X direction) thereof and that of the shorter side (a distance in the Y direction) thereof are in the order of 0.6 μm, and 0.25 μm, respectively. An interval between the rectangular shapes adjacent to each other is in the order of 0.13 μm in the X direction and in the order of 0.18 μm in the Y direction, respectively. Respective resist patterns 28 shown in FIG. 14(B), obtained as a result of the simulation, would be identical in shape and size to the respective image patterns 26 without the influence of the optical proximity effect. In practice, however, the respective resist patterns 28 obtained as a result of the simulation are found rounder or receding as compared with the shape of the respective image patterns 26.

FIG. 15(A) is a schematic illustration showing a conventional photomask 30. The photomask 30 comprises light transmitting parts 32, and a light shielding part 34. The respective light transmitting parts 32 are in the same rectangular shape as shown in FIG. 14(A), but differs in a layout plan. More specifically, the same are disposed in a zigzagged, that is, staggered grid format. Further, an interval between the light transmitting parts 32 linearly adjacent to each other, in the X direction, is equal to the length (in the order of 0.6 μm) of the longer side of the respective light transmitting parts 32. Such a layout of the light transmitting parts 32 is a layout frequently adopted in designing a photomask for fabrication of a semiconductor device.

Respective resist patterns 38 shown in FIG. 15(B), obtained as a result of a simulation, would be identical in shape and size to respective image patterns 36 without the influence of the optical proximity effect. In practice, however, the respective resist patterns 38 obtained as a result of the simulation are found rounder or receding as compared with the shape of the respective image patterns 36.

FIG. 16(A) is a schematic illustration showing a conventional photomask 40. The photomask 40 comprises light transmitting parts 42, and a light shielding part 44. The respective light transmitting parts 42 are in the same rectangular shape as shown in FIG. 14(A), but differs in a layout plan. More specifically, the same are disposed in a zigzagged grid format. Further, an interval between the light transmitting parts 42 linearly adjacent to each other, in the X direction, is shorter than the length (in the order of 0.6 μm) of the longer side of the respective light transmitting parts 42. That is, the light transmitting parts 42 shown in FIG. 16(A) are disposed at a higher density in the X direction in comparison with the layout of the light transmitting parts 32, shown in FIG. 15(A). Such a layout of the light transmitting parts 42 also is a layout frequently adopted in designing a photomask for fabrication of a semiconductor device.

Respective resist patterns 48 shown in FIG. 16(B), obtained as a result of a simulation, would be identical in shape and size to respective image patterns 46 without the influence of the optical proximity effect. In practice, however, the respective resist patterns 48 obtained as a result of the simulation are found rounder or receding as compared with the shape of the respective image patterns 46.

FIG. 17(A) is a schematic illustration showing a conventional photomask 50. The photomask 50 comprises light transmitting parts 52, and a light shielding part 54. As shown in FIG. 17(A), respective light transmitting parts 52 in a line-like shape are disposed so as to be apart from each other in the X direction. The respective light transmitting parts 52 in the line-like shape are called a mask pattern. The length of a shorter side (width) of the respective light transmitting part 52 is in the order of 0.2 μm. An interval between the light transmitting parts 52 adjacent to each other, in the X direction, is in the order of 0.3 μm.

Respective resist patterns 58 as shown in FIG. 17(B), obtained as a result of a simulation, would be identical in shape and size to respective image patterns 56 without the influence of the optical proximity effect. In practice, however, the respective resist patterns 58 obtained as a result of the simulation are found rounder or receding as compared with the shape of the respective image patterns 56.

Thus, as shown in FIGS. 14 to 17, pattern fidelity is found deteriorated due to the optical proximity effect.

SUMMARY OF THE INVENTION

In order to solve the problem described in the foregoing, the present invention has been developed, and an object of the invention is to provide a photomask for transferring a plurality of mask patterns to an object for exposure (for example, a resist film), formed on a semiconductor substrate by allowing exposure light to be transmitted therethrough or shielded therewith.

The photomask according to the invention comprises a plurality of first mask patterns (also referred to as main mask patterns) for transferring the patterns to the object for exposure, disposed apart from each other in a first direction, and second mask patterns each having a width not larger than a resolution limit, linked with one end of each of the plurality of the first mask patterns. With such a configuration as described above, since the second mask patterns are provided, it is possible to increase exposure light intensity at junctions between the respective second mask patterns and the respective first mask patterns. Further, since the respective second mask patterns have the width not larger than a resolution limit, the same will not be transferred to a resist film. Accordingly, pattern fidelity of resist patterns as formed is improved.

Furthermore, the invention provides a method of fabricating a semiconductor device, comprising the steps of applying a resist film onto a substrate, executing exposure using the photomask comprising the plurality of the first mask patterns for transferring the patterns to the resist film, disposed apart from each other in the first direction, and the second mask patterns each having the width not larger than a resolution limit, linked with one end of each of the plurality of the first mask patterns, and patterning the resist film. By the method of fabricating a semiconductor device as described, it is possible form resist patterns while restraining an optical proximity effect.

BRIEF DESCRIPTION OF THE DRAWINGS

While the specification concludes with claims particularly pointing out and distinctly claiming the subject matter which is regarded as the invention, it is believed that the invention, the objects, features, and advantages thereof will be better understood from the following description taken in connection with the accompanying drawings in which:

DETAILED DESCRIPTION OF THE PREFERRED EMBODIMENTS

Preferred embodiments of the invention are described hereinafter with reference to the accompanying drawings. The drawings are nothing but schematic illustrations broadly showing shape, size, and layout to the extent that the invention can be better understood. It is therefore to be pointed out that the invention should be in no way limited by the drawings.

FIGS. 1 to 12 are views illustrating first to sixth embodiments of the invention, respectively. Respective embodiments are described hereinafter with reference to a schematic view showing a photomask, a schematic view showing part of a mask pattern (light transmitting part), and a schematic view illustrating the result of a simulation. The schematic view showing the photomask and the schematic view illustrating the result of the simulation are shown in the same form as the previously described form. That is, the schematic view illustrating the result of the simulation shows resist patterns as obtained together with image patterns. A pattern size used in describing the image patterns is not the size of the mask pattern itself of the photomask, but a proportionally reduced size (a ratio of reduction is the reduction ratio of a reduction-type projection aligner used in an exposure step).

The photomask according to the respective embodiments is described in sequence hereinafter.

First Embodiment

Referring to FIG. 1, a first embodiment of a photomask according to the invention is first described.

Figure 1A:
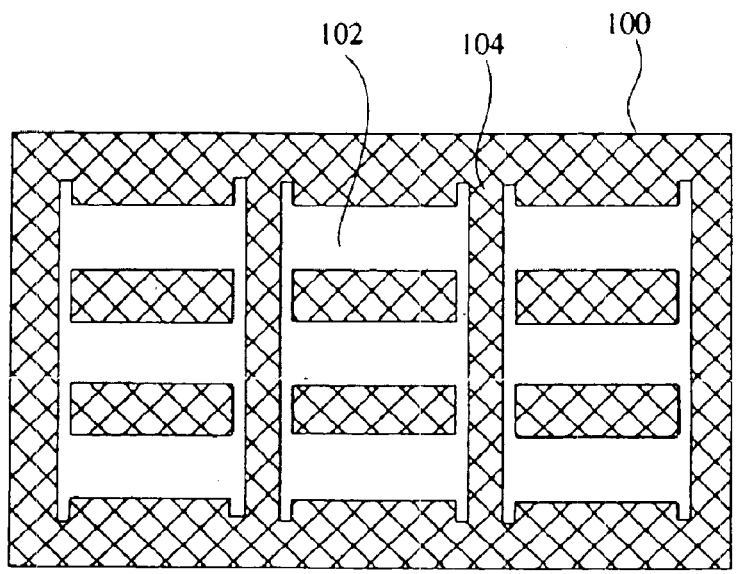
FIG. 1 is a schematic view illustrating a first embodiment of a photomask according to the invention.
Figure 1B:
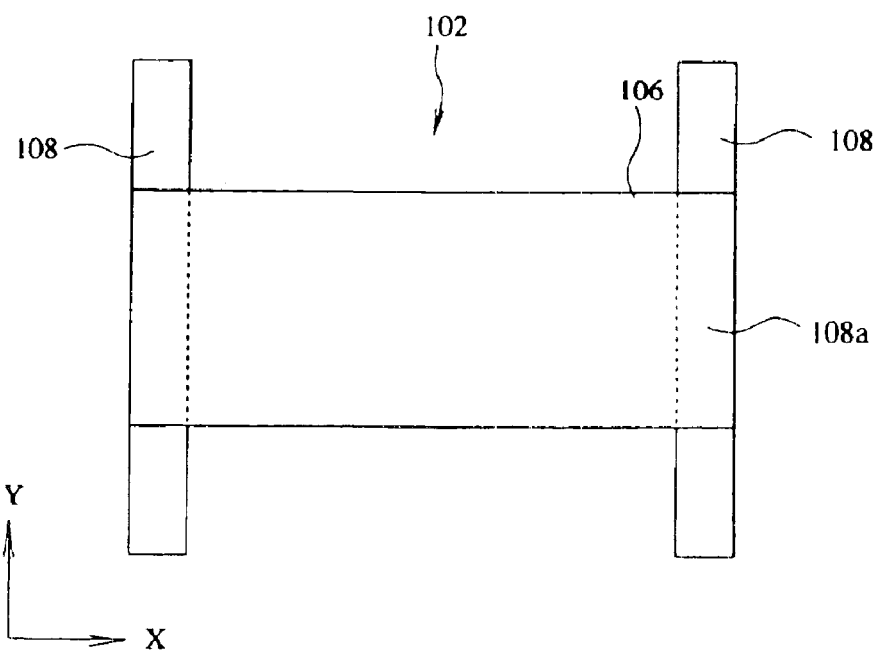

FIG. 1(A) is a schematic view showing the photomask 100 according to the first embodiment. The photomask 100 comprises light transmitting parts 102 which are hollow parts, and a light shielding part 104 which is a crosshatched part. In this embodiment, the shape of the respective light transmitting parts 102 are described as a mask pattern. FIG. 1(B) is a schematic view showing part of the mask patterns. The mask patterns of the photomask 100, shown in FIG. 1(A), are formed by adding a plurality of mask patterns (hollow) in a line-like shape to the same mask patterns of the photomask, as previously described with reference to FIG. 14(A), and the respective mask patterns in the line-like shape have a width not larger than a resolution limit.

More specifically, the photomask according to the first embodiment of the invention comprises a plurality of first mask patterns 106 (also referred to as main mask patterns) for transferring resist patterns to a resist placed on a semiconductor substrate, disposed so as to be apart from each other in the Y direction as a first direction, and second mask patterns 108 in a line-like shape, linked to the opposite ends of each of the plurality of the first mask patterns 106, respectively. That is, the mask patterns according to the present embodiment comprise a pair of the second mask patterns 108 in the line-like shape, disposed so as to be apart from each other in the X direction and to be parallel with each other in the Y direction, and the plurality of the first mask patterns 106 disposed so as to be apart from each other in the Y direction, and linked with each other by the pair of the second mask patterns 108 in the line-like shape. Further, since the respective second mask patterns 108 in the line-like shape have a width not larger than a resolution limit, the same will not be transferred as a pattern to the resist.

FIG. 1(B) shows a connection relationship between the first mask pattern 106 and the pair of the second line-like mask patterns 108. The first mask pattern 106 is in a rectangular shape while the respective mask patterns 108 are in the line-like shape. The first mask pattern and the respective second mask patterns overlap each other at a portion 108a {as shown by a phantom dotted line in FIG. 1(B)}, respectively.

As shown in FIG. 1(A), the mask patterns according to the first embodiment correspond to a plurality of the second mask patterns in the line-like shape, added to the same mask pattern as described with reference to FIG. 14(A). Thus, because such a simple shape is merely added, it becomes possible to optimize the formation of resist patterns with a fewer parameters, so that correction of the mask patterns can be executed with ease.

Now, referring to FIG. 2, the restrictive effect of an optical proximity effect is described hereinafter.

Figure 2:
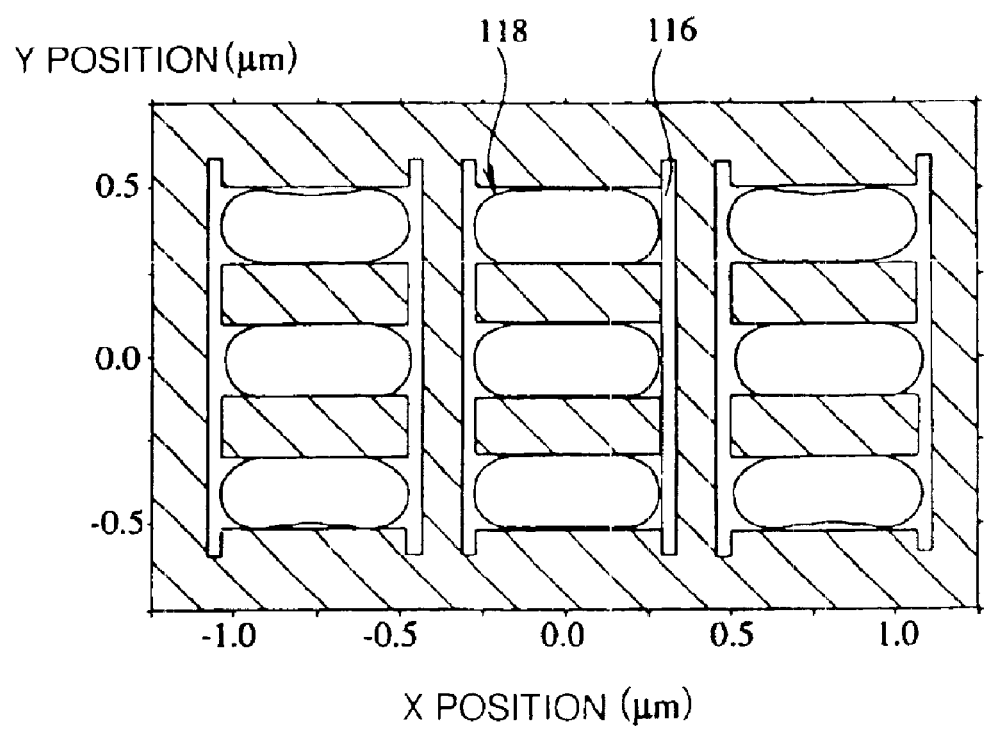
FIG. 2 is a schematic view showing results of simulation with reference to the first embodiment.

FIG. 2 is a schematic view showing results of the simulation with reference to the first embodiment. In FIG. 2, there are shown image patterns 116, which are hollow parts, surrounded by a diagonal part, and the resist patterns 118.

Figure 14A:
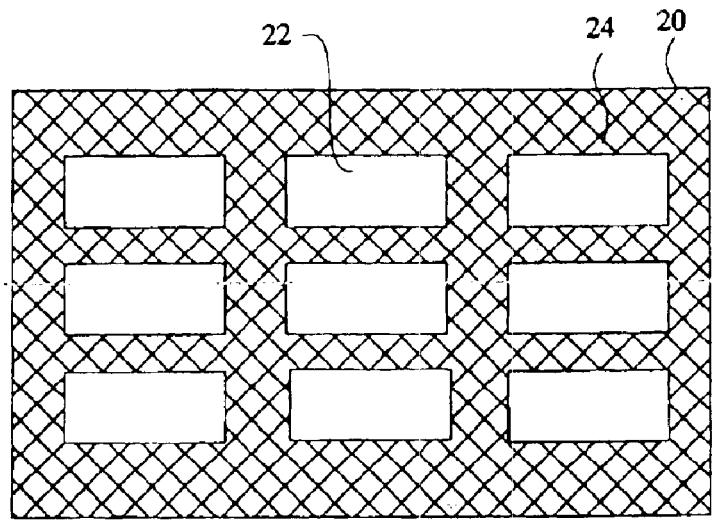
FIG. 14 is a schematic illustration showing a conventional photomask.

In this embodiment, the shape and layout of respective rectangular shapes are the same as those shown in FIG. 14(A). That is, the length of the longer side and that of the shorter side of the respective rectangular shapes are 0.6 μm, and 0.25 μm, respectively. The line-like shape added to the respective rectangular shapes has a width (distance in the X direction) of 0.05 μm. A simulation was performed under the same conditions as those for the case of FIG. 14(B).

Figure 14B:
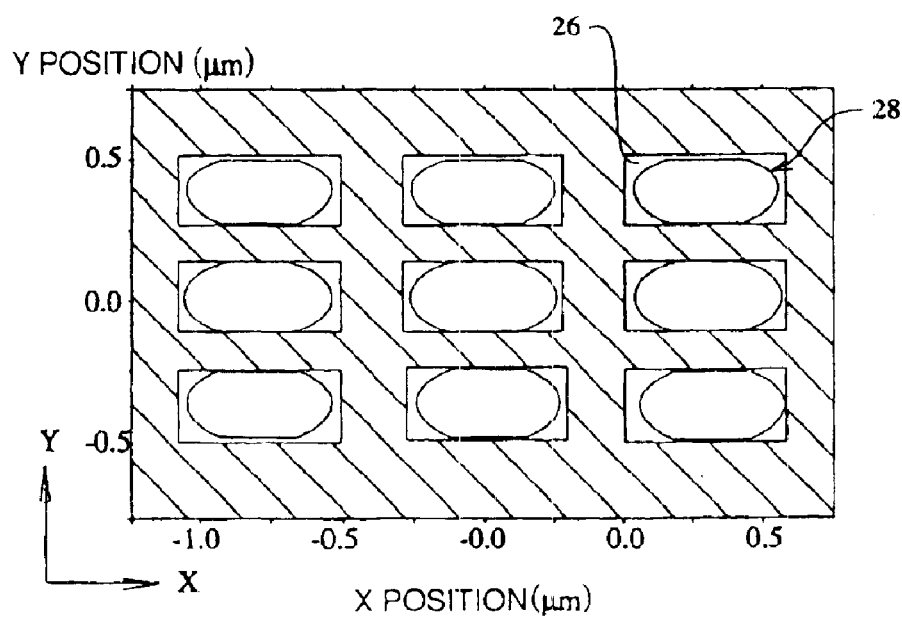

Now, the respective resist patterns 118 are compared with the respective resist patterns 28 shown in FIG. 14(B). However, the simulation was performed with respect to only a region shown in the figure owing to constraints, and consequently, the respective resist patterns (nine in this example) shown in the same figure are not identical in shape to each other due to boundary conditions, and so forth. Accordingly, the resist patterns positioned at the center of the respective figures are compared with each other (the same applies to other embodiments described hereinafter). With the resist pattern 118, roundness and backdown of the edge thereof are found restrained in comparison with the case of the resist pattern 28, resulting in improvement of pattern fidelity. This is due to the effect of an increase in light intensity at the corners (four corners) of the rectangular shape because the line-like shape was added to the rectangular shape.

Moreover, since data on the line-like shape only were added in this case, a fewer simulation parameters were involved, and time for the simulation was short. In contrast, if the respective rectangular shapes are individually corrected (transformed), there will be an increase in the number of parameters (design data), and time required for the simulation will increase.

With this embodiment, the case where the respective resist patterns 118 are formed of a positive resist is described, however, the same effect can be obtained even in the case where the respective resist patterns 118 are formed of a negative resist. In the case of the negative resist being adopted, a closed region surrounded by a solid line within the respective hollow parts in FIG. 2, that is, the resist pattern becomes dot parts.

Further, with this embodiment, the crosshatched part in FIG. 1(A) is used as the light shielding part, and the hollow parts in FIG. 1(A) are used as the light transmitting parts, however, in the case of mask patterns formed such that functions of the respective parts described are reversed, the same effect also can be obtained. More specifically, the crosshatched part in FIG. 1(A) is used as a light transmitting part while the hollow parts in FIG. 1(A) are used as light shielding parts. With such mask patterns, excessive spreading and bending of light waves due to diffraction can be prevented by providing the respective second mask patterns in the line-like shape acting the light shielding parts. Accordingly, backdown of the edge of the respective resist patterns can be restrained, resulting in improvement of pattern fidelity.

Second Embodiment

Subsequently, a second embodiment of a photomask according to the invention is described with reference to FIG. 3.

Figure 3A:
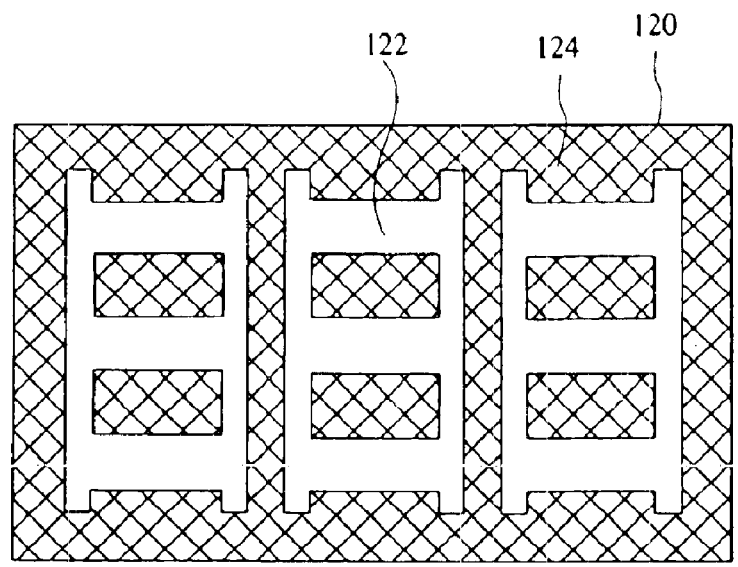
FIG. 3 is a schematic view illustrating a second embodiment of a photomask according to the invention.
Figure 3B:
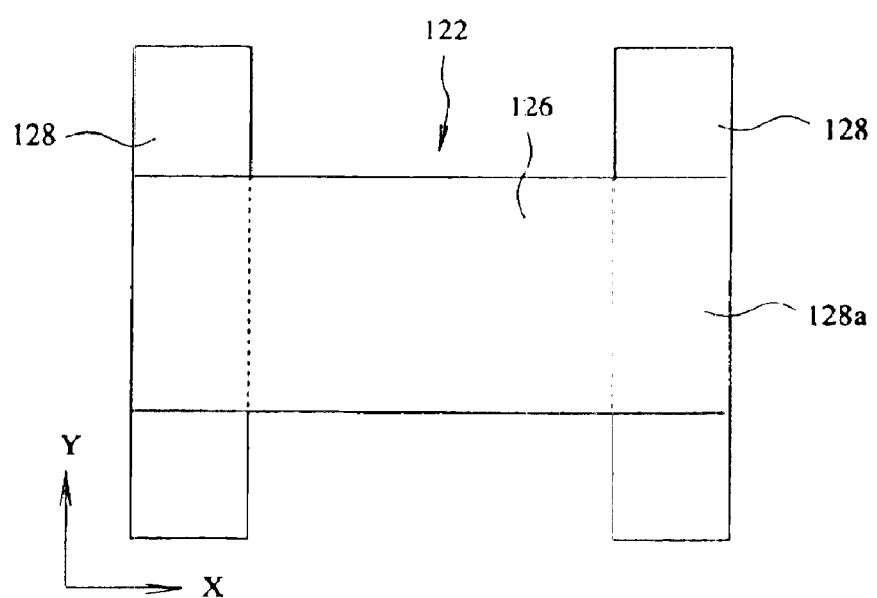

FIG. 3(A) is a schematic view showing the photomask 120 according to the second embodiment. The photomask 120 comprises light transmitting parts 122, and a light shielding part 124. In this embodiment, the shape of the respective light transmitting parts 122 is described as a mask pattern. FIG. 3(B) is a schematic view showing part of the mask patterns. The mask patterns of the photomask 120 shown in FIG. 3(A) are formed by adding a plurality of mask patterns in a line-like shape to the same mask patterns of the photomask as previously described with reference to FIG. 14(A). The mask patterns according to the second embodiment has a configuration similar to that for the first embodiment, but differs therefrom in that a width (distance in the X direction) of the respective mask patterns in the line-like shape is larger. With this embodiment as well, each of the mask patterns in the line-like shape has a width not larger than a resolution limit.

More specifically, the photomask according to the resent embodiment of the invention comprises a plurality of first mask patterns 126 for transferring resist patterns to a resist placed on a semiconductor substrate, disposed so as to be apart from each other in the Y direction as a first direction, and a second mask pattern 128 in a line-like shape, linked to the opposite ends of each of the plurality of the first mask patterns 126, respectively.

That is, the mask patterns comprise the plurality of the first mask patterns 126 linked together by a pair of the second mask patterns 128 in the line-like shape, disposed so as to be apart from each other in the X direction and to be parallel with each other in the Y direction. Further, since each of the second mask patterns in the line-like shape also has a width not larger than a resolution limit, the same will not be transferred as a pattern to the resist.

FIG. 3 (B) shows a connection relationship between the first mask pattern 126 and the pair of the second mask patterns 128. The first mask pattern 126 is in a rectangular shape while the respective second mask patterns 128 are in the line-like shape. Both the first mask pattern and the respective second mask patterns overlap each other at a portion 128a {as shown by a phantom dotted line in FIG. 3 (B)}, respectively.

Thus, the mask pattern according to the second embodiment differs from the mask pattern according to the first embodiment in that there is a difference in the width of the second mask pattern. The width of the second mask pattern 128 according to the second embodiment is larger than that of the second mask pattern 108 according to the first embodiment.

Moreover, the second mask pattern 128 is formed to have a width such that resist patterns obtained by performing a simulation are not to be linked with each other on the longer side thereof by taking into account a size, layout interval, and so forth of the first mask patterns 126 which are main patterns.

Figure 4:
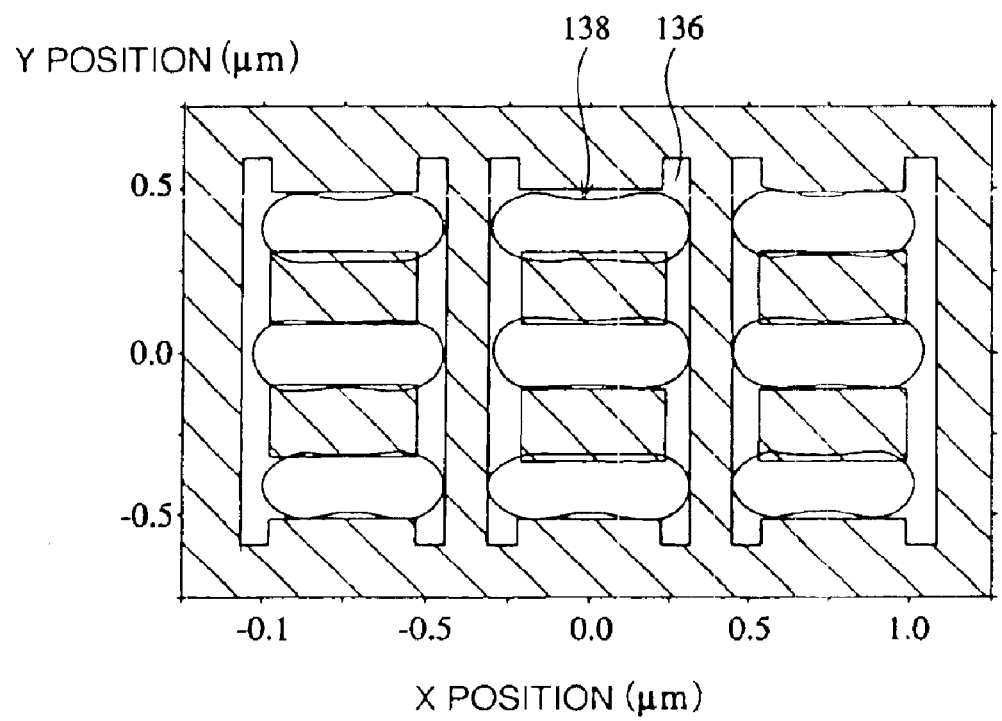
FIG. 4 is a schematic view showing results of simulation with reference to the second embodiment.

Now, referring to FIG. 4, the restrictive effect of an optical proximity effect is described hereinafter. FIG. 4 is a schematic view showing results of the simulation with reference to the second embodiment. In FIG. 4, there are shown image patterns 136 for the second embodiment, and resist patterns 138 obtained by the simulation.

In this embodiment, the shape and layout of respective rectangular shapes are the same as those shown in FIG. 14(A). That is, the length of the longer side and that of the shorter side of the respective rectangular shapes are 0.6 μm, and 0.25 μm, respectively. The line-like shape added to the respective rectangular shapes has a width (distance in the X direction) in the order of 0.1 μm. A simulation was performed under the same conditions as those for the case of FIG. 14(B).

Now, the respective resist patterns 138 are compared with the respective resist patterns 28 shown in FIG. 14(B). With the respective resist patterns 138, roundness and backdown of the edge thereof are found restrained in comparison with the case of the resist pattern 28, resulting in improvement of pattern fidelity. This is due to the effect of an increase in light intensity at the corners (four corners) of the rectangular shape because the line-like shape was added to the rectangular shape.

Further, due to the difference in the width of the respective second mask patterns 128, light intensity at junctions between the respective second mask patterns 128 and the respective first mask patterns 126 becomes higher than that for the first embodiment. Accordingly, the resist patterns according to the second embodiment have an amount of backdown, smaller than that of the resist patterns 118 according to the first embodiment, and an area of portions of a resist, on the edge of holes thereof, is expanded. This will enable the respective resist patterns to be easily bonded with a pattern, formed at a lower layer or an upper layer, on edge spots, so that occurrence of faulty bonding, due to a misalignment in superposition with the pattern at the lower layer or the upper layer, can be reduced. Herein, the edge spots refer to, for example, spots for a connection with a gate electrode in the case of a transistor, spots of the lower layer or the upper layer, provided with a metallization pattern in the case of a wiring layer, and so forth.

In comparing the second embodiment with the first embodiment, it can be said that variation in the shape of the resist patterns can be simulated simply by varying a parameter, that is, the width of the second mask patterns in the line-like shape. The width (distance in the X direction) of the second mask patterns in the line-like shape is preferably optimized on the basis of process conditions (an illumination condition of a projection aligner, and the characteristics of the resist), a size of the respective first mask patterns, and so forth. By forming the respective second mask patterns into the line-like shape, it becomes possible to perform the simulation with a fewer parameters, and in shorter time. Accordingly, optimum correction conditions can be applied with ease.

With this embodiment, the case where the respective resist patterns 138 are formed of a positive resist is described, however, the same effect can be obtained even in the case where the respective resist patterns 138 are formed of a negative resist. In the case of the negative resist being adopted, the respective resist patterns shown in FIG. 4 become dot parts.

Further, with this embodiment, the crosshatched part in FIG. 3(A) is used as the light shielding part, and the hollow parts in FIG. 3(A) are used as the light transmitting parts, however, in the case of mask patterns formed such that functions of the respective parts described are reversed, the same effect also can be obtained. More specifically, the crosshatched part in FIG. 3(A) is used as a light transmitting part while the hollow parts in FIG. 3(A) are used as light shielding parts. With such mask patterns, excessive spreading and bending of light waves due to diffraction can be prevented by providing the respective second mask patterns in the line-like shape, acting as the light shielding parts. Accordingly, backdown of the edge of the respective resist patterns can be restrained, resulting in improvement of pattern fidelity.

Third Embodiment

Subsequently, a third embodiment of a photomask according to the invention is described with reference to FIG. 5.

Figure 5A:
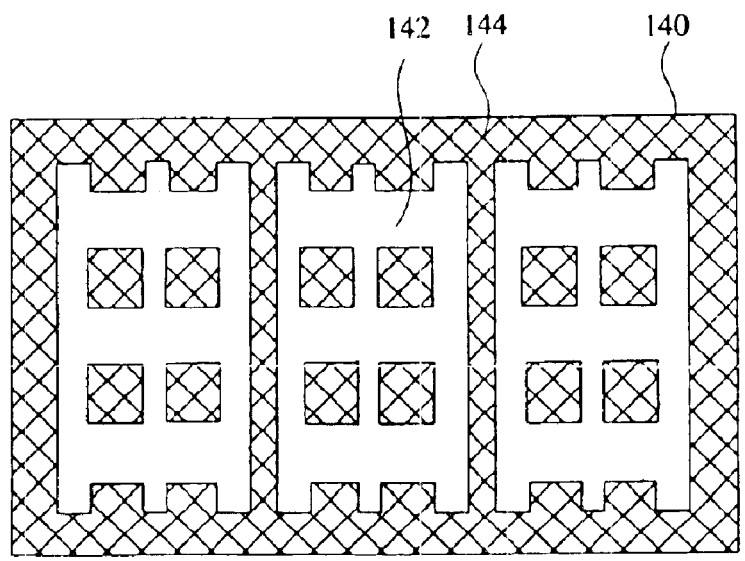
FIG. 5 is a schematic view illustrating a third embodiment of a photomask according to the invention.
Figure 5B:
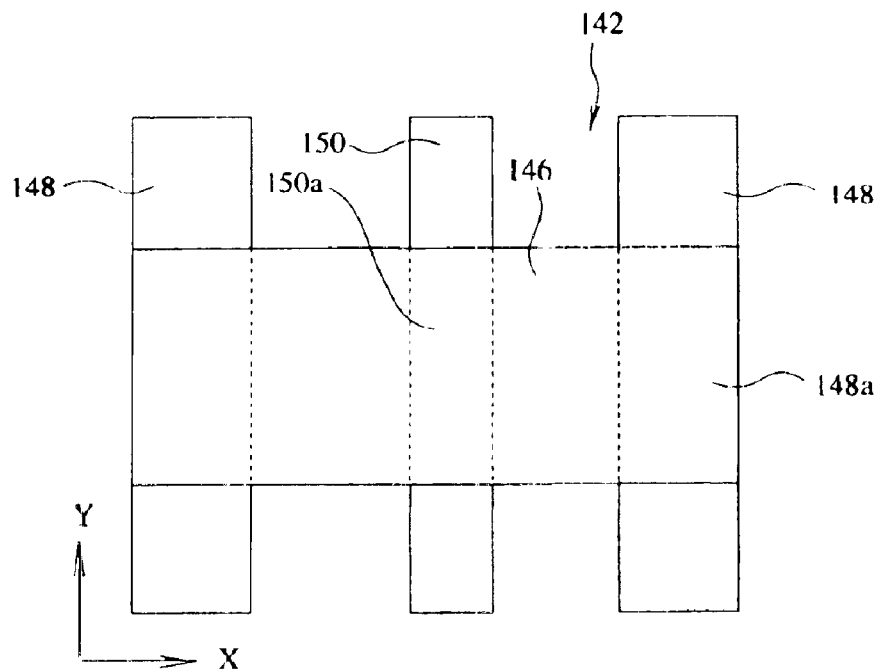

FIG. 5(A) is a schematic view showing the photomask 140 according to the third embodiment. The photomask 140 comprises light transmitting parts 142, and a light shielding part 144. In this embodiment, the shape of the respective light transmitting parts 142 is described as a mask pattern. FIG. 5(B) is a schematic view showing part of the mask patterns. The mask patterns of the photomask 140 shown in FIG. 5(A) are formed by adding a plurality of mask patterns in a line-like shape to the same mask patterns of the photomask as previously described with reference to FIG. 14(A). In addition, the mask patterns according the third embodiment have a configuration wherein third mask patterns (hollow) in a line-like shape are added to the mask patterns according to the second embodiment at the same time. Further, the respective third mask patterns in the line-like shape have a width (distance) shorter than the width of respective second mask patterns in a line-like shape, and not larger than a resolution limit.

More specifically, the photomask according to the present embodiment comprises a pair of the second mask patterns 148 in the line-like shape, disposed apart from each other in the X direction, but parallel with each other in the Y direction, a plurality of first mask patterns 146 disposed apart from each other in the Y direction, and linked together by the respective pairs of the second mask patterns 148 in the line-like shape, and a third mask pattern 150 in a line-like shape, disposed between the respective pairs of the second mask patterns 148 so as to be apart in the X direction from the respective second mask patterns 148 in the line-like shape.

FIG. 5(B) shows a connection relationship between the first mask pattern 146, the second mask patterns 148, and the third mask pattern 150. The first mask pattern 146 is in a rectangular shape while the respective second mask patterns 148 are in the line-like shape. Both the first mask pattern and second mask patterns overlap each other at a portion 148a {as shown by a phantom dotted line in FIG. 5(B)}, respectively. The third mask pattern 150 in the line-like shape is disposed substantially at the center of the first mask pattern 146, and both the mask patterns overlap each other at a portion 150a {as shown by a phantom dotted line in FIG. 5(B)}.

Thus, the mask patterns according to the third embodiment differ from the mask patterns according to the second embodiment in that the third line-like mask pattern is added between the respective pairs of the second mask patterns.

Figure 6:
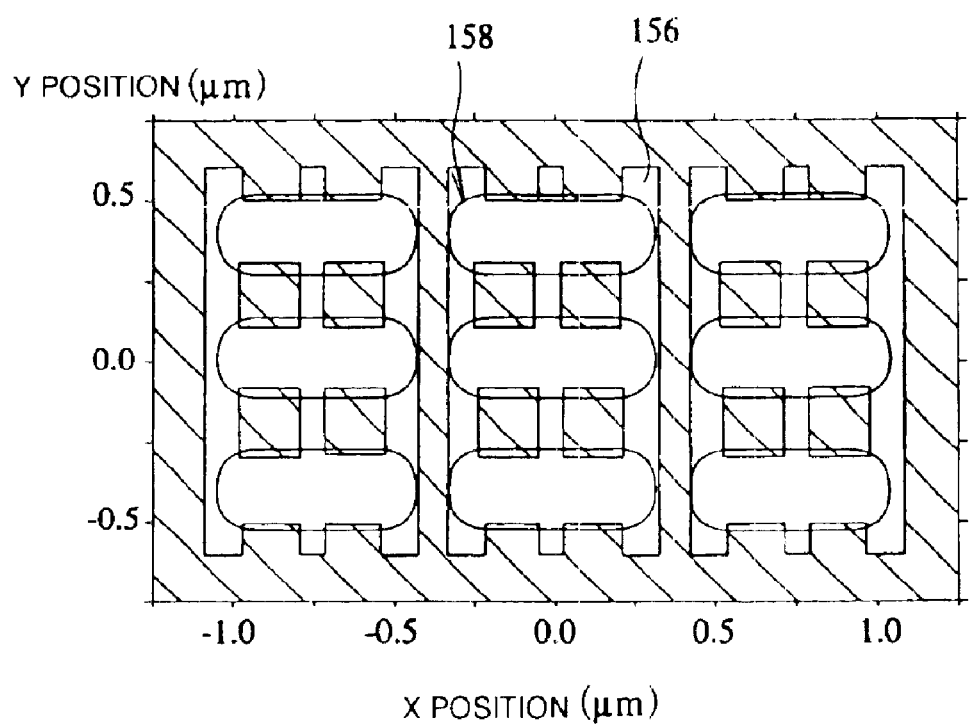
FIG. 6 is a schematic view showing results of simulation with reference to the third embodiment.

Now, referring to FIG. 6, the restrictive effect of an optical proximity effect is described hereinafter. FIG. 6 is a schematic view showing results of a simulation with reference to the third embodiment. In FIG. 6, there are shown image patterns 156 for the third embodiment, and resist patterns 158 obtained by the simulation.

In this embodiment, the shape and layout of respective rectangular shapes are the same as those shown in FIG. 14(A). That is, the length of the longer side and that of the shorter side of the respective rectangular shapes are in the order of 0.6 μm, and 0.25 μm, respectively. The line-like shape of the respective second mask patterns added to the respective rectangular shapes has a width (distance in the X direction) in the order of 0.1 μm. Further, the line-like shape of the respective third mask patterns added thereto has a width (distance in the X direction) in the order of 0.07 μm.

The reason why the width of the line-like shape of the respective third mask patterns is rendered shorter than that of the line-like shape of the respective second mask patterns is because light intensity at the center of the respective rectangular shapes is higher than that at both ends thereof, so that there will arise a risk of resist patterns adjacent to each other in the Y direction being linked with each other. A simulation was performed under the same conditions as those for the case of FIG. 14(B).

Now, respective resist patterns 158 are compared with the respective resist patterns 28 shown in FIG. 14(B). With the respective resist patterns 158, roundness and backdown of the edge thereof are found restrained in comparison with the case of the resist pattern 28, resulting in improvement of pattern fidelity. This is due to the effect of an increase in light intensity at the corners (four corners) of the respective rectangular shapes because the line-like shapes were added to the respective rectangular shapes.

Upon comparing the respective resist patterns 158 with the respective resist patterns 138 according to the second embodiment, it is found that the former are in the shape of a rectangle with the longer sides thereof, extending in a straight line from the center to opposite ends thereof, indicating further enhancement in pattern fidelity. This is due to the effect of an increase in light intensity at a junction between the respective third mask patterns and the respective first mask patterns.

An area of portions of a resist, on the edge of holes thereof, is expanded. This will enable the respective resist patterns to be easily bonded with a pattern, formed at a lower layer or an upper layer, on edge spots, so that occurrence of faulty bonding, due to a misalignment in superposition with the pattern at the lower layer or the upper layer, can be reduced.

Further, an area of the respective resist patterns 158 according to the third embodiment becomes slightly larger than that of the rectangular shape, however, this will cause no problem unless inconvenience results in performing other steps of fabricating a semiconductor device. Also, taking advantage of the results of the simulation, the size of the main patterns may be changed so that the resist pattern can be designed to a desired size.

Further, with this embodiment, the case where the respective resist patterns 158 are formed of a positive resist is described, however, the same effect can be obtained even in the case where the respective resist patterns 158 are formed of a negative resist. In the case of the negative resist being adopted, the respective resist patterns shown in FIG. 6 become dot parts.

Further, with this embodiment, the crosshatched part in FIG. 5(A) is used as the light shielding part, and the hollow parts in FIG. 5(A) are used as the light transmitting parts, however, in the case of mask patterns formed by reversing functions of the respective parts described, the same effect also can be obtained. More specifically, the crosshatched part in FIG. 5(A) is used as a light transmitting part while the hollow parts in FIG. 5(A) are used as light shielding parts. With such a mask pattern, excessive spreading and bending of light waves due to diffraction can be prevented by providing the respective second mask patterns and the respective third mask patterns, in the line-like shape, both acting as the light shielding parts. Accordingly, backdown of the edge of the respective resist patterns can be restrained, resulting in improvement of pattern fidelity.

Fourth Embodiment

Subsequently, a fourth embodiment of a photomask according to the invention is described with reference to FIG. 7.

Figure 7A:
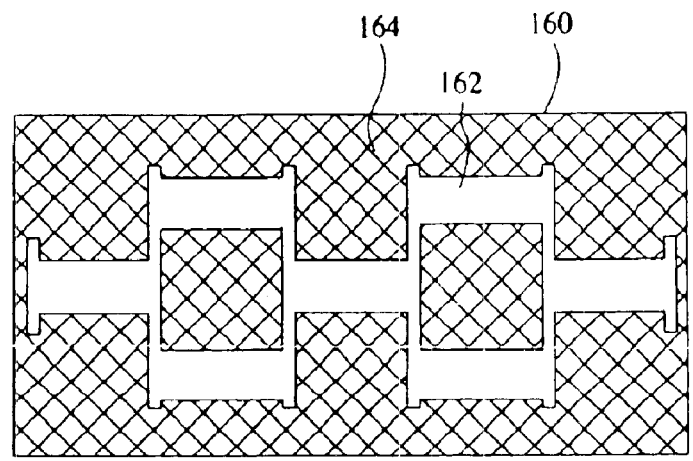
FIG. 7 is a schematic view illustrating a fourth embodiment of a photomask according to the invention.
Figure 7B:
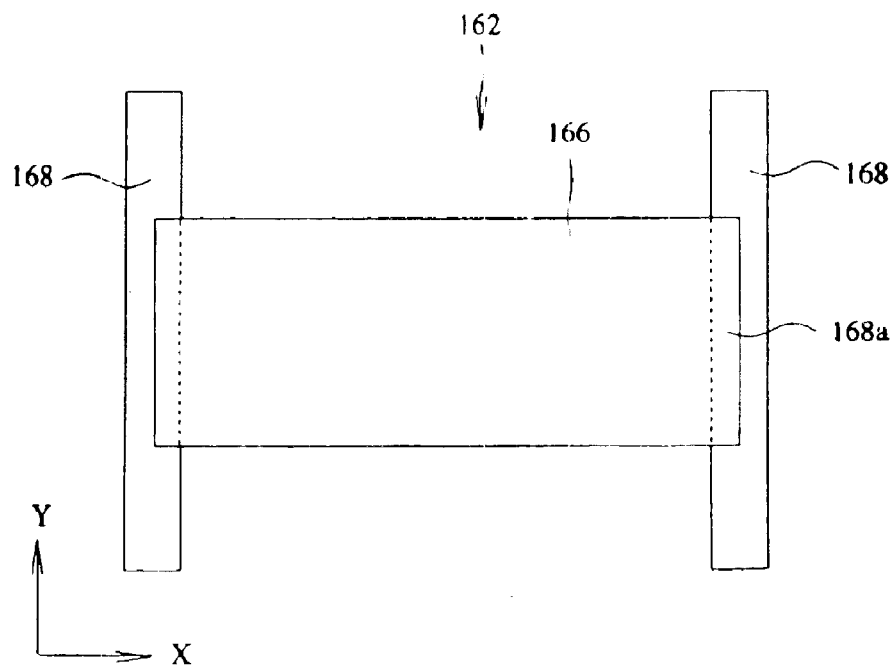

FIG. 7(A) is a schematic view showing the photomask 160 according to the fourth embodiment. The photomask 160 comprises light transmitting parts 162 which are hollow parts, and a light shielding part 164 which is a crosshatched part. In this embodiment, the shape of the respective light transmitting parts 162 is described as a mask pattern. FIG. 7(B) is a schematic view showing part of the mask patterns. The mask patterns of the photomask 160 shown in FIG. 7(A) are formed by adding a plurality of mask patterns (hollow) in a line-like shape to the same mask patterns of the photomask, as previously described with reference to FIG. 15(A), and the mask patterns in the line-like shape have a width not larger than a resolution limit.

More specifically, the photomask according to the fourth embodiment comprises a plurality of first mask patterns 166 disposed so as to be adjacent to each other, and second mask patterns 168 in a line-like shape, extending in the Y direction, disposed in such a way as to link together the respective first mask patterns 166 in a staggered format. That is, the plurality of the first mask patterns 166 are disposed in a zigzagged, that is, staggered grid format in the X and Y directions, respectively. And, the opposite ends of the respective first mask patterns 166 are linked with the respective second mask patterns 168 in the line-like shape, linearly extending in the Y direction. Since the respective second mask patterns 168 in the line-like shape have a width not larger than a resolution limit, the same will not be transferred as a pattern to the resist.

FIG. 7(B) shows a connection relationship between the first mask pattern 166 and the second mask patterns 168. The first mask pattern 166 is in a rectangular shape while the respective second mask patterns 168 are in the line-like shape. Both the first mask pattern and the respective second mask patterns overlap each other at a portion 168a {as shown by a phantom dotted line in FIG. 7(B)}, respectively. Because the length of the first mask pattern, in the X direction, (the length of the longer side thereof) is equal to an interval in the X direction, at which the first mask patterns are disposed, it is possible to implement a layout such that the center line of the respective second mask patterns 168 in the line-like shape is superposed on each of the shorter sides of the first mask pattern 166 in the rectangular shape. The present embodiment differs in this respect from the first to third embodiments. With the adoption of such a layout, the first mask patterns 166 disposed in the staggered grid format can be linked with each other by the respective second mask patterns 168 in the line-like shape. The layout of the first mask patterns as shown in FIG. 7(A) is a layout frequently used in designing a photomask for use in fabrication of a semiconductor device.

Figure 8:
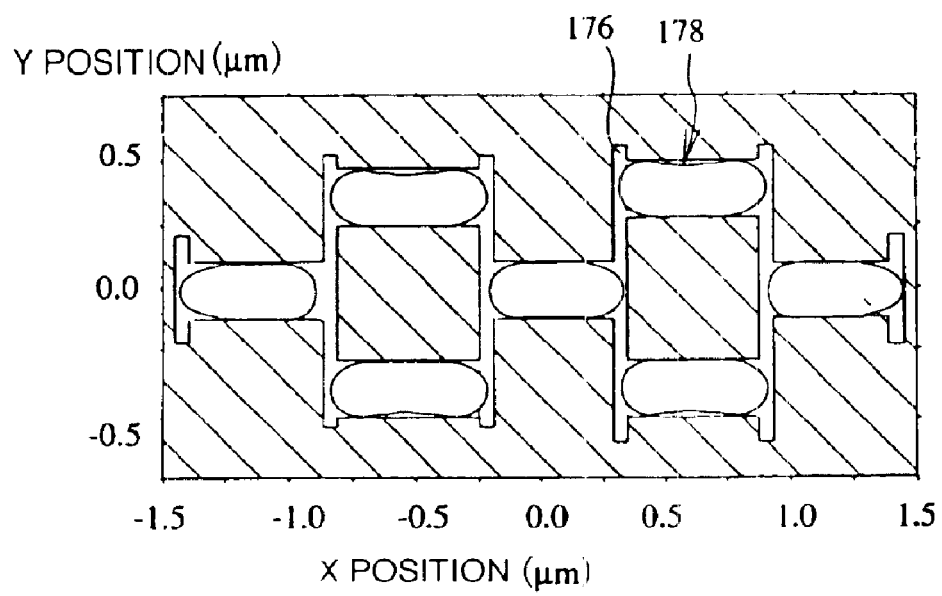
FIG. 8 is a schematic view showing results of simulation with reference to the fourth embodiment.

Now, referring to FIG. 8, the restrictive effect of an optical proximity effect is described hereinafter. FIG. 8 is a schematic view showing results of a simulation with reference to the fourth embodiment. In FIG. 8, there are shown image patterns 176 which are hollow parts surrounded by a diagonal part, and resist patterns 178.

Figure 15A:
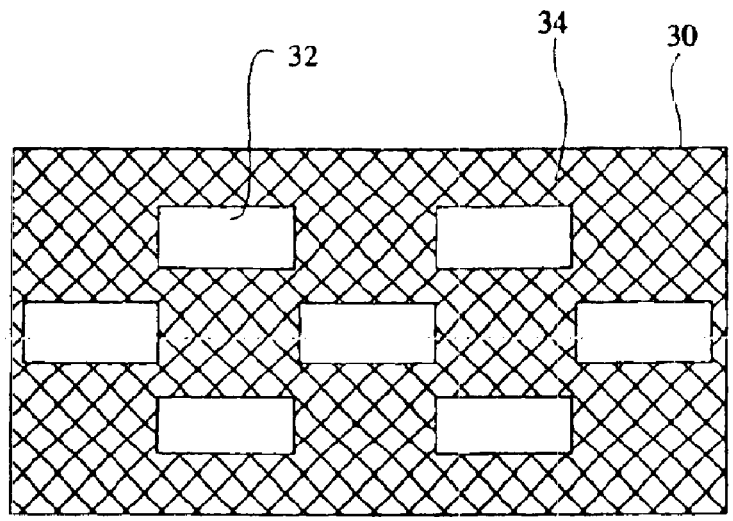
FIG. 15 is a schematic illustration showing another conventional photomask.

In this embodiment, the shape and layout of respective rectangular shapes are the same as those shown in FIG. 15(A). That is, the length of the longer side and that of the shorter side of the respective rectangular shapes are in the order of 0.6 $\mu$m, and 0.25 $\mu$m, respectively. An interval between the rectangular shapes adjacent to each other, in the X direction, is in the order of 0.6 $\mu$m, equivalent to the length of the longer side of the respective rectangular shapes. The respective second mask patterns 168 in the line-like shape have a width (distance in the X direction) in the order of 0.05 $\mu$m. A simulation was performed under the same conditions as those for the case of FIG. 15(B).

Figure 15B:
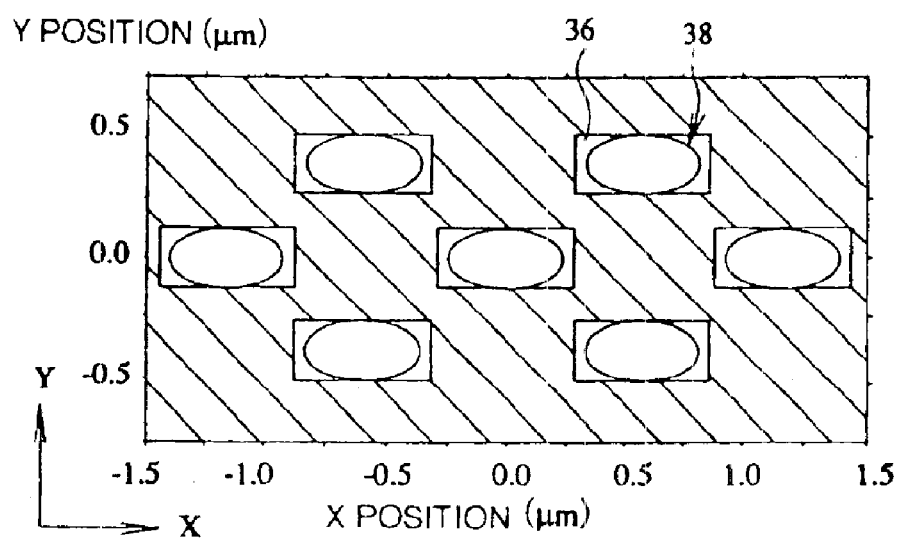

Now, the respective resist patterns 178 are compared with the respective resist patterns 38 shown in FIG. 15(B). With the respective resist patterns 178, roundness and backdown of the edge thereof are found restrained in comparison with the case of the respective resist patterns 38, indicating improvement of pattern fidelity. This is due to the effect of an increase in light intensity at the corners (four corners) of the respective rectangular shapes because the line-like shapes were added to the respective rectangular shapes.

An area of portions of a resist, on the edge of holes thereof, is expanded. This will enable the respective resist patterns to be easily bonded with a pattern, formed at a lower layer or an upper layer, on edge spots, so that occurrence of faulty bonding, due to a misalignment in superposition with the pattern at the lower layer or the upper layer, can be reduced.

Moreover, since data on the line-like shape only are added in this case, a fewer simulation parameters are involved, and time for the simulation is short. In contrast, if the respective rectangular shapes are individually corrected (transformed), there will be an increase in the number of parameters (design data), and time required for the simulation will increase.

With this embodiment, the case where the respective resist patterns 178 are formed of a positive resist is described, however, the same effect can be obtained even in the case where the respective resist patterns 178 are formed of a negative resist. In the case of the negative resist being adopted, the respective resist patterns in FIG. 8 become dot parts.

Further, with this embodiment, the crosshatched part in FIG. 7(A) is used as the light shielding part, and the hollow parts in FIG. 7(A) are used as the light transmitting parts, however, in the case of mask patterns formed by reversing functions of the respective parts described, the same effect also can be obtained. More specifically, the crosshatched part in FIG. 7(A) is used as a light transmitting part while the hollow parts in FIG. 7(A) are used as light shielding parts. With such a mask pattern, excessive spreading and bending of light waves due to diffraction can be prevented by providing the respective second mask patterns in the line-like shape acting as the light shielding parts. Accordingly, backdown of the edge of the respective resist patterns can be restrained, resulting in improvement of pattern fidelity.

Fifth Embodiment

Subsequently, a fifth embodiment of a photomask according to the invention is described with reference to FIG. 9.

Figure 9A:
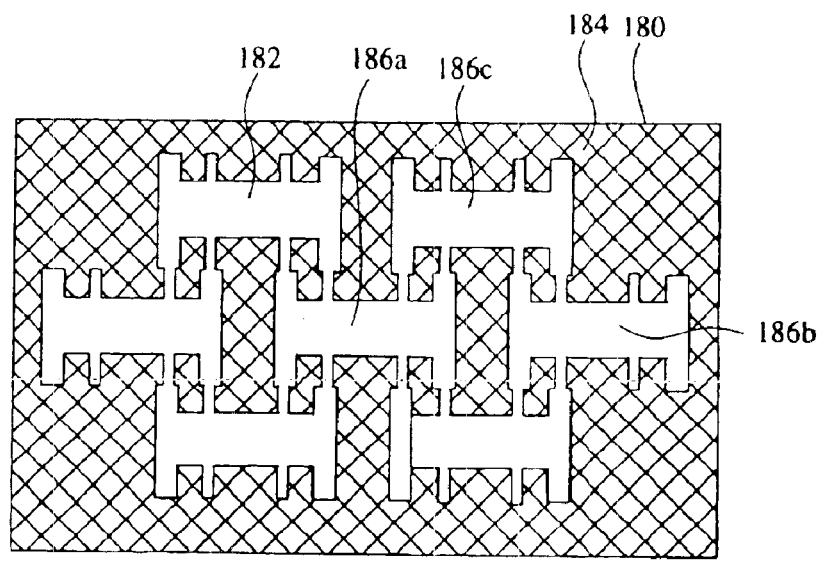
FIG. 9 is a schematic view illustrating a fifth embodiment of a photomask according to the invention.
Figure 9B:
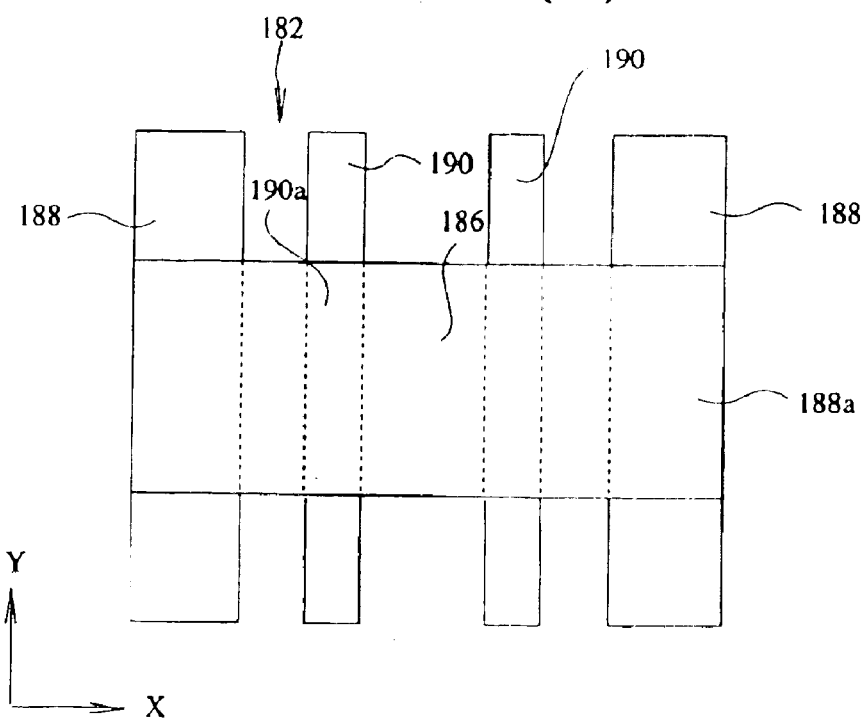

FIG. 9(A) is a schematic view showing the photomask 180 according to the fifth embodiment. The photomask 180 comprises light transmitting parts 182 which are hollow parts, and a light shielding part 184 which is a crosshatched part. In this embodiment, the shape of the respective light transmitting parts 182 is described as a mask pattern. FIG. 9(B) is a schematic view showing part of the mask patterns. The mask patterns of the photomask 180 shown in FIG. 9(A) are formed by adding a plurality of mask patterns (hollow) in a line-like shape with a cyclically varying line width to the same mask patterns of the photomask as previously described with reference to FIG. 16(A), and the mask patterns in the line-like shape have respective widths not larger than a resolution limit.

More specifically, the photomask according to the fifth embodiment comprises a plurality of first mask patterns 186 as shown in FIG. 9(A), second mask patterns 188 in a line-like shape, linearly disposed so as to link together the respective first mask patterns, and fourth mask patterns 190 in a line-like shape.

With the fifth embodiment, the plurality of the first mask patterns 186 are disposed in a zigzagged format, in the X direction and Y direction, respectively. In contrast with the fourth embodiment, an interval between the first mask patterns 186 adjacent to each other, in the X direction, is shorter than the length of the longer side of the respective first mask patterns 186. The layout of the first mask patterns as shown in FIG. 9(A) is a layout frequently used in designing a photomask for use in fabrication of a semiconductor device. Further, the first mask patterns 186 are disposed at a higher density in comparison with the layout of the first mask patterns, shown in FIG. 7(A). For the sake of clarity in describing a layout relationship of the plurality of the first mask patterns 186, the first mask pattern 186 disposed at the center of FIG. 9(A) is referred to as a first mask pattern 186a, the first mask pattern 186 disposed apart from the first mask pattern 186a in the Y direction, and linked therewith is referred to as a first mask pattern 186c (for example, disposed in the upper right side part of the figure), and the first mask pattern 186 disposed apart from the first mask pattern 186a in the X direction is referred to as a first mask pattern 186b (for example, disposed in the right side part of the figure) for differentiation. As described in the foregoing, an interval between the first mask pattern 186a and first mask pattern 186b is shorter than the length of the longer side of the respective first mask patterns 186. As a result, the first mask pattern 186c is linked with the mask pattern 190 in the line-like shape, disposed on the first mask pattern 186a while isolated from the first mask pattern 186a in the Y direction, and is disposed so as to be linked with the second mask pattern 188. With the adoption of such a layout, the first mask patterns 186 disposed in the staggered grid format can be linked with each other by the respective second mask patterns 188 in the line-like shape and the respective fourth mask patterns 190 in the line-like shape.

Accordingly, the mask patterns according the fifth embodiment correspond to line-like patterns consisting of the plurality of the fourth mask patterns 190 as well as the second mask patterns 188, added to the same mask patterns as previously described with reference to FIG. 16(A). The layout of the first mask patterns as shown in FIG. 9(A) is a layout frequently used in designing a photomask for use in fabrication of a semiconductor device.

FIG. 9(B) shows a connection relationship among the first mask pattern 186, the second mask patterns 188, and the fourth mask patterns 190. In the figure, a portion 188a indicates an overlapping part of the first mask pattern 186 and the respective second mask patterns 188, and a portion 190a indicates an overlapping part of the first mask pattern 186 and the respective fourth mask patterns 190 {as shown by a phantom dotted line in FIG. 9(B)}.

Figure 10:
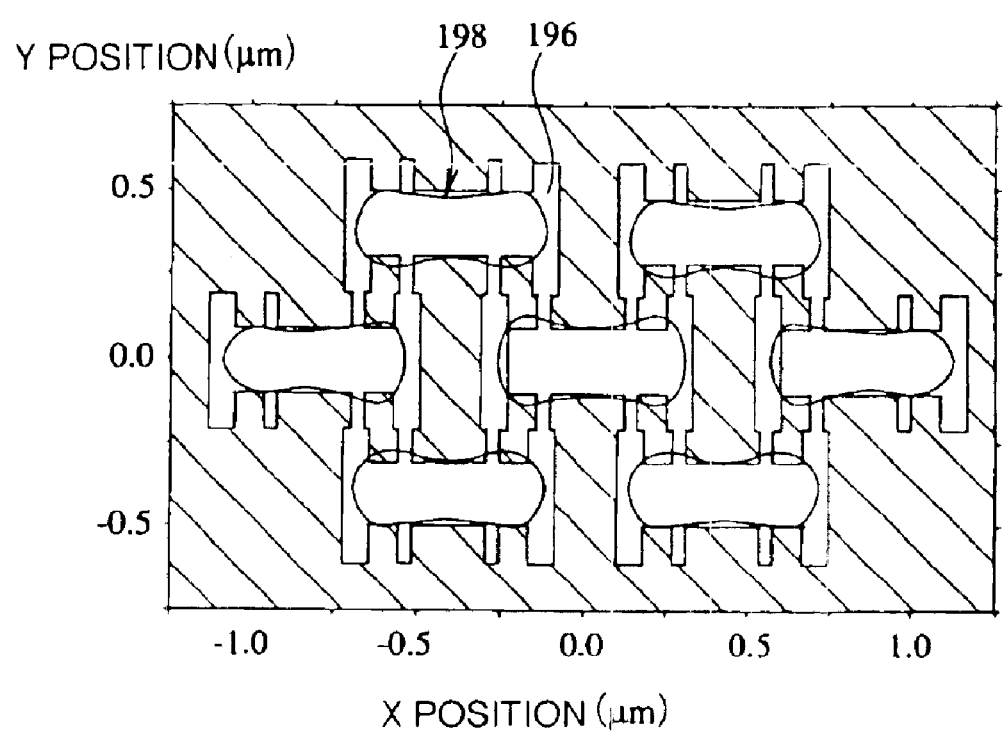
FIG. 10 is a schematic view showing results of simulation with reference to the fifth embodiment.

Now, referring to FIG. 10, the restrictive effect of an optical proximity effect is described hereinafter. FIG. 10 is a schematic view showing results of a simulation with reference to the fifth embodiment. In FIG. 10, there are shown image patterns 196 which are hollow parts surrounded by a diagonal part, and resist patterns 198 obtained by the simulation.

Figure 16A:
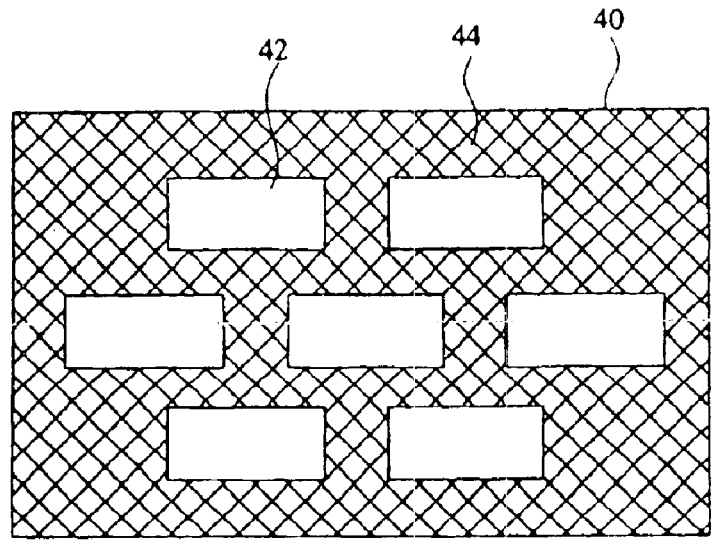
FIG. 16 is a schematic illustration showing still another conventional photomask.

In this embodiment, the size and layout of respective rectangular shapes are the same as those shown in FIG. 16(A). That is, the length of the longer side and that of the shorter side of the respective rectangular shapes are in the order of 0.6 μm, and 0.25 μm, respectively. An interval between the rectangular shapes adjacent to each other, in the X direction, is in the order of 0.15 μm, shorter than the length of the longer side of the respective rectangular shapes. The width (distance in the X direction) of the line-like shape at the opposite ends of the respective rectangular shapes is in the order of 0.09 µm. The width (distance in the X direction) of the line-like shapes in the vicinity of the center of the respective rectangular shapes is in the order of 0.05 µm. The reason for such difference in the width being provided between the line-like shapes is because light intensity at the center of the respective rectangular shapes is higher than that at the opposite ends thereof, so that there will arise a risk of the resist patterns formed adjacent to each other being linked with each other. A simulation was performed under the same conditions as those for the case of FIG. 16(B).

Figure 16B:
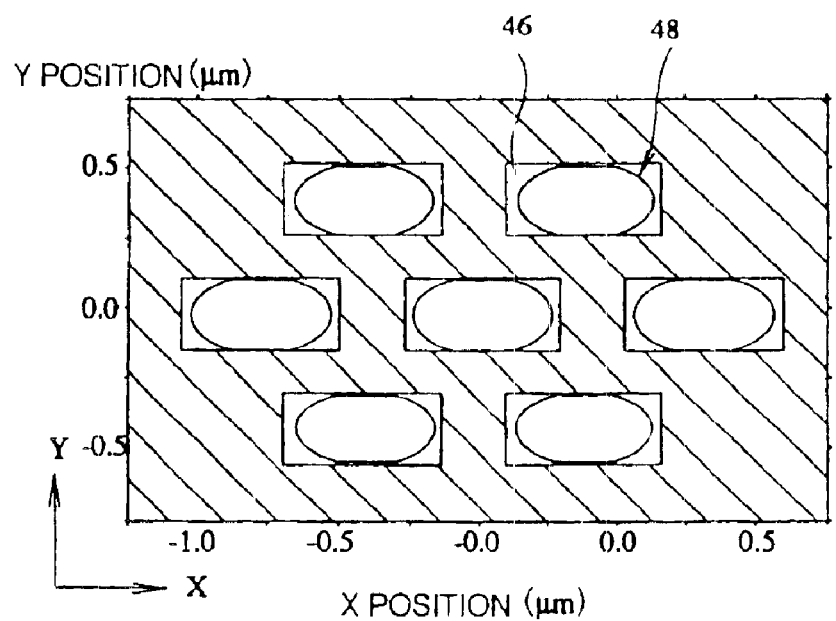

Now, the respective resist patterns 198 are compared with the respective resist patterns 48 shown in FIG. 16(B). With the respective resist patterns 198, roundness and backdown of the edge thereof are found restrained in comparison with the case of the respective resist patterns 48, indicating improvement of pattern fidelity. This is due to the effect of an increase in light intensity at the corners (four corners) of the respective rectangular shapes because the line-like shapes are added to the respective rectangular shapes.

An area of portions of a resist, on the edge of holes thereof, becomes wider. This will enable the resist pattern to be easily bonded with a pattern, formed at a lower layer or an upper layer, on edge spots, so that occurrence of faulty bonding, due to a misalignment in superposition with the pattern at the lower layer or the upper layer, can be reduced.

Further, since, in this case, the patterns for compensational purposes are rendered in the line-like shape, and are simply added to the mask patterns as shown in FIG. 16(B), a fewer simulation parameters are involved, and time for the simulation is short. In contrast, if the respective rectangular shapes are individually corrected, there will be an increase in the number of parameters, and time required for the simulation will increase.

With this embodiment, the case where the respective resist patterns 198 are formed of a positive resist is described, however, the same effect can be obtained even in the case where the respective resist patterns 198 are formed of a negative resist. In the case of the negative resist being adopted, the respective resist patterns in FIG. 10 become dot parts.

Further, with this embodiment, the crosshatched part in FIG. 9(A) is used as the light shielding part, and the hollow parts in FIG. 9(A) are used as the light transmitting parts, however, in the case of mask patterns formed by reversing functions of the respective parts described, the same effect also can be obtained. More specifically, the crosshatched part in FIG. 9(A) is used as a light transmitting part while the hollow parts in FIG. 9(A) are used as light shielding parts. With such mask patterns, excessive spreading and bending of light waves due to diffraction can be prevented by providing the second mask patterns and the fourth mask patterns, both in the line-like shape, acting as the light shielding parts. Accordingly, backdown of the edge of the respective resist patterns can be restrained, resulting in improvement of pattern fidelity.

Sixth Embodiment

Subsequently, a sixth embodiment of a photomask according to the invention is described with reference to FIG. 11.

Figure 11A:
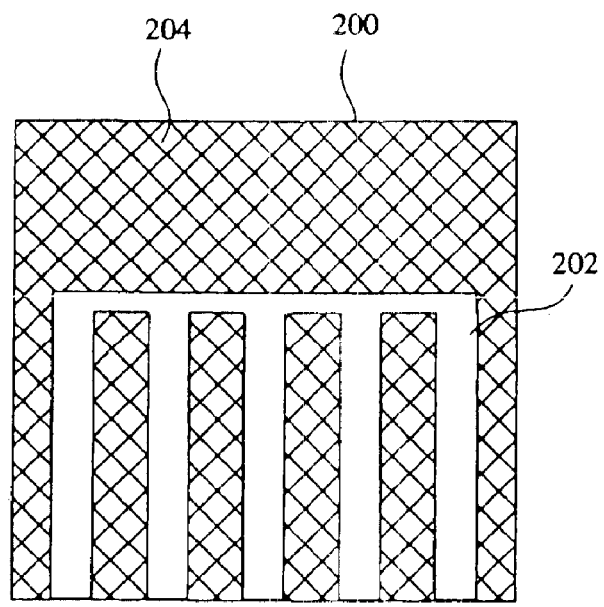
FIG. 11 is a schematic view illustrating a sixth embodiment of a photomask according to the invention.
Figure 11B:
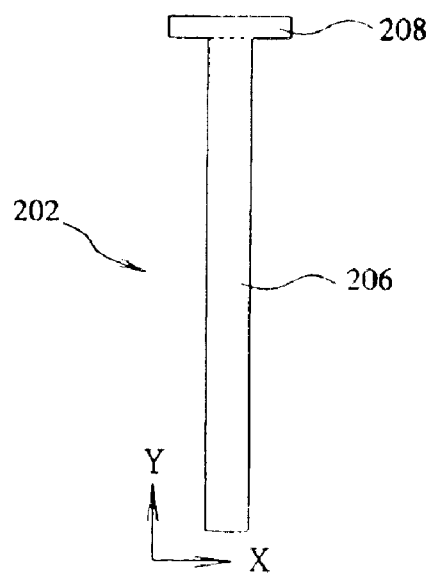
Figure 17A:
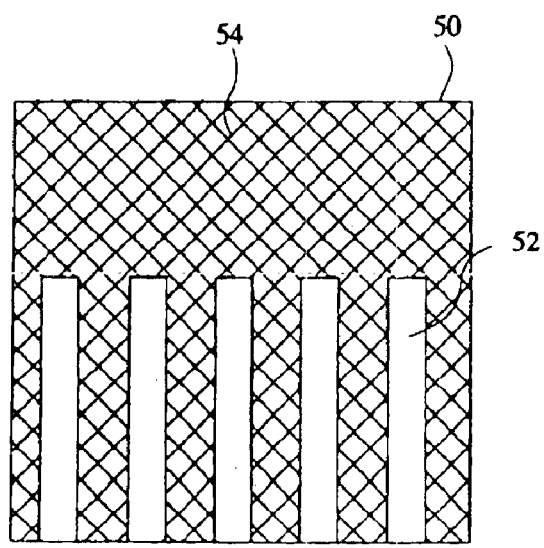
FIG. 17 is a schematic illustration showing yet another conventional photomask.

FIG. 11(A) is a schematic view showing the photomask 200 according to the sixth embodiment. The photomask 200 comprises a light transmitting part 202 which is a hollow part, and light shielding parts 204 which are crosshatched parts. In this embodiment, the shape of the light transmitting part 202 is described as a mask pattern. FIG. 11(B) is a schematic view showing part of the mask patterns. The mask patterns of the photomask 200 shown in FIG. 11(A) are formed by adding a length of a mask pattern in a line-like shape to the same mask patterns of the photomask as previously described with reference to FIG. 17(A), and the mask pattern in the line-like shape has a width not larger than a resolution limit.

More specifically, the photomask according to the present embodiment comprises a plurality of first mask patterns 206 in a line-like shape for transferring resist patterns to a resist placed on a semiconductor substrate, disposed so as to be apart from each other in the X direction, as a first direction, and a second mask pattern 208 in a line-like shape, linked with one end of each of the plurality of the first mask patterns.

FIG. 11(B) shows a connection relationship between the first mask pattern 206 and the second mask pattern 208. In the figure, a broken line part indicates a boundary between the first mask pattern 206 in the line-like shape and the second mask pattern 208 in the line-like shape. In this embodiment, there does not exist an overlapping part of the respective first mask patterns 206 in the line-like shape with the second mask pattern 208 in the line-like shape. The second mask pattern 208 in the line-like shape is a mask pattern having a width narrower than the width of the respective first mask patterns 206 in the line-like shape. Both the mask patterns are disposed such that the longitudinal direction of the respective first mask patterns 206 in the line-like shape is orthogonal to that of the second mask pattern 208 in the line-like shape. That is, the respective first mask patterns 206 are disposed such that the longitudinal direction thereof is oriented in the Y direction while the second mask pattern 208 is disposed such that the longitudinal direction thereof is oriented in the X direction.

With the present embodiment, a configuration is described wherein the second mask pattern 208 as well as the respective first mask patterns 206 does not have an overlapping part, however, as with the first to fifth embodiments, an overlapping part can be provided. In such a case, however, since the respective first mask patterns 206, which are main mask patterns according to the sixth embodiment, are in the line-like shape, correction of only one end thereof will suffice. In other words, mask patterns adjacent to each other in the Y direction do not in effect exist. Accordingly, the second mask pattern for compensating for the optical proximity effect is disposed in such a way as to be adjoined and securely attached to the one end of the respective first mask patterns, and by performing a simulation while varying only the width of the second mask pattern, as a parameter, an optimum correction value can be obtained easily and in a short time.

As shown in FIG. 11(A), the plurality of the first mask patterns 206 are disposed such that the second mask pattern 208 is linearly linked thereto. With the present embodiment, the plurality of the first mask patterns 206 are disposed so as to be parallel with each other in the X direction, and at regular intervals, and the respective first mask patterns 206 are connected with each other at the end thereof by the second mask pattern 208 in the line-like shape, linearly extending in the X direction.

Figure 12:
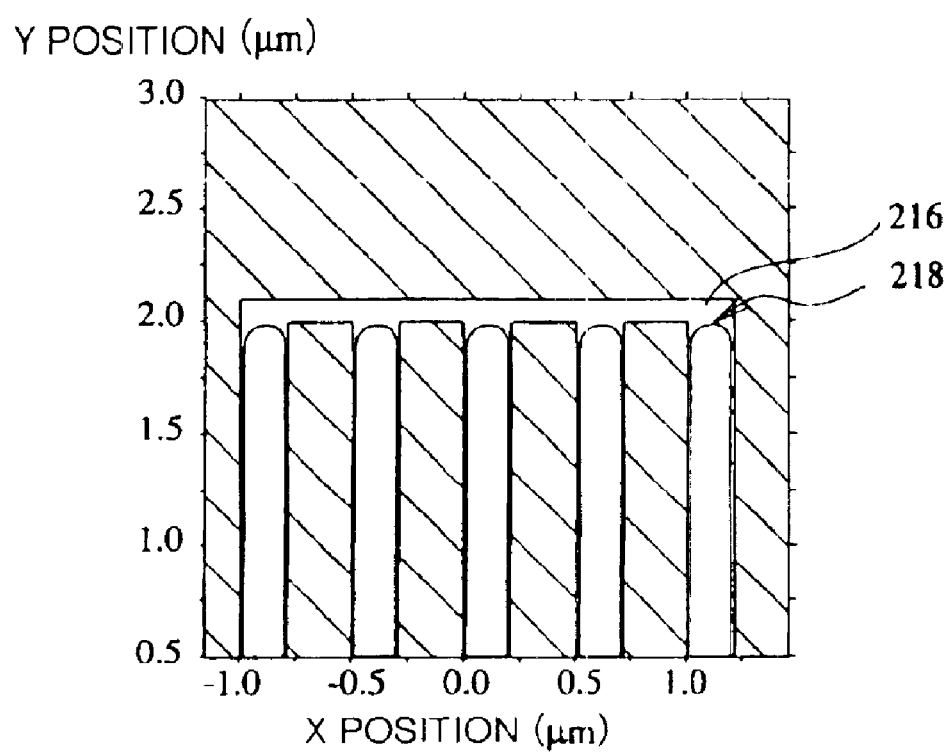
FIG. 12 is a schematic view showing results of simulation with reference to the sixth embodiment.
Figure 13:
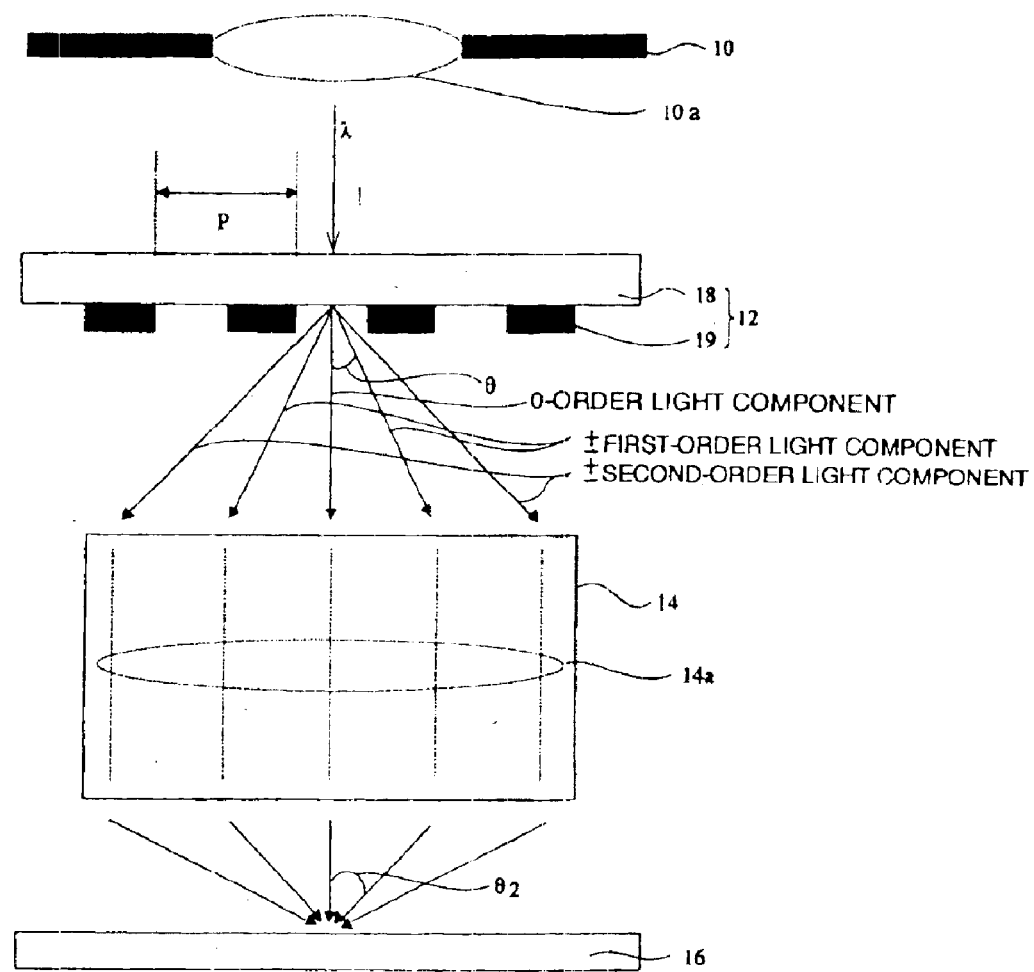
FIG. 13 is a schematic view showing an exposure system using a typical reduction-type projection aligner.

Referring to FIG. 12, the restrictive effect of the optical proximity effect is described hereinafter. FIG. 12 is a schematic view showing results of a simulation with reference to the sixth embodiment. In FIG. 12, there are shown image patterns 216 which are hollow parts surrounded by diagonal parts, and resist patterns 218 obtained by the simulation.

In this embodiment, the shorter side of the line-like shape of the plurality of the first mask patterns 206 is in the order of 0.2 μm in length. Respective intervals between the first mask patterns 206 adjacent to each other, in the X direction, are in the order of 0.3 μm. The width (distance in the Y direction) of the second mask pattern 208 in the line-like shape, used for compensational purposes, is in the order of 0.05 μm. A simulation was performed under the same conditions as those for the case of FIG. 17(B).

Figure 17B:
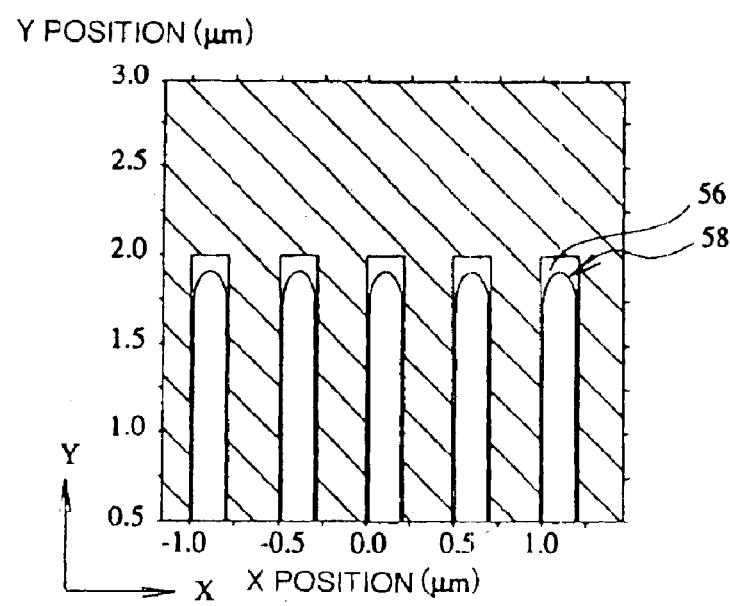

Now, the respective resist patterns 218 are compared with the respective resist patterns 58 shown in FIG. 17(B). With the respective resist patterns 218, roundness and backdown of the edge thereof are found restrained in comparison with the case of the respective resist patterns 58, indicating improvement of pattern fidelity. This is due to the effect of an increase in light intensity occurring at a junction between the respective first mask patterns in the line-like shape and the second mask pattern in the line-like shape since the second mask pattern 208 in the line-like shape is provided. Further, since the second mask pattern has a width not larger than a resolution limit, the same will not be transferred in a slit form to the resist.

Moreover, since the mask pattern for compensational purposes is rendered in the line-like shape, and is simply added to the mask patterns shown in FIG. 17, a fewer simulation parameters are involved, and time for the simulation is short. Accordingly, correction can be implemented in a shorter time in comparison with the case of individually correcting the line-like shape of the respective first mask patterns.

Further, with this embodiment, the case where the respective resist patterns 218 are formed of a positive resist is described, however, the same effect can be obtained even in the case where the respective resist patterns 218 are formed of a negative resist. In the case of the negative resist being adopted, a region within the respective hollow parts in FIG. 12, indicated by a solid line, corresponds to a line part of the respective resist patterns. Accordingly, portions of the resist pattern, at the tip of the respective line parts, will have a wider area. This will enable the resist pattern to be easily bonded with a pattern, formed at a lower layer or an upper layer, on tip spots, so that occurrence of faulty bonding, due to a misalignment in superposition with the pattern at the lower layer or the upper layer, can be reduced.

Further, the position of the tip of the line parts can be matched to a design size with ease. As shown in FIG. 17, the position of the tip of the line parts is at 2.0 μm along the Y axis according to the design size. In contrast, the position of the tip of the respective resist patterns after correction, as shown in FIG. 12, substantially coincides therewith.

Further, with this embodiment, the crosshatched part in FIG. 11 (A) is used as the light shielding part, and the hollow parts in FIG. 11(A) are used as the light transmitting parts, however, in the case of mask patterns formed by reversing functions of the respective parts described, the same effect also can be obtained. More specifically, the crosshatched part in FIG. 11(A) is used as a light transmitting part while the hollow parts in FIG. 11(A) are used as light shielding parts. With such mask patterns, excessive spreading and bending of light waves due to diffraction can be prevented by providing the second mask pattern in the line-like shape, acting as the light shielding part. Accordingly, backdown of the edge of the respective resist patterns can be restrained, resulting in improvement of pattern fidelity. In the case where such mask patterns as reversed are applied to a positive resist, the respective resist patterns correspond to line parts.

With the first to fifth embodiments, the invention has been described wherein the first mask patterns having a length shorter in the X direction or the Y direction are adopted, however, as described with reference to the sixth embodiment, the first mask patterns applicable to the invention may be in the shape of mask patterns having a length longer in the X direction or the Y direction.

Further, with the use of the photomask as described with reference to the first to sixth embodiments, respectively, a semiconductor device can be fabricated. That is, by means of a process comprising the step of applying a resist film onto a substrate, and an exposure step using the photomask as described with reference to the respective embodiments, the resist film can be patterned. There is no need for any particular change in the process except for the use of the photomask according to the invention. Further, since a simulation for photomask designing can be efficiently performed, a suitable shape of resist patterns can be obtained.

With the photomask according to the invention, the mask patterns of the light transmitting parts comprises the plurality of the first mask patterns which are the main mask pattern, and the second mask patterns for linking together the respective first mask patterns at the opposite ends thereof, having a width not larger than a resolution limit, and by providing the second mask patterns, exposure light intensity, at junctions between the respective second mask patterns and the respective first mask patterns, can be raised, so that the optical proximity effect is restrained, thereby resulting in improvement of pattern fidelity.

Further, the second mask patterns are in the line-like shape, and even if the same are added to the first mask patterns, an increase of the simulation parameters is limited to a few, and an increase in simulation time is only for a short duration. Accordingly, a variety of simulations can be efficiently performed, thereby enabling suitably corrected patterns to be obtained with ease.

Furthermore, by performing the exposure step of a method of fabricating a semiconductor device, using the photomask according to the invention, suitable resist patterns can be formed.

What is claimed is:

1. A photomask for transferring a plurality of patterns to an object for exposure, formed on a semiconductor substrate, comprising:

a plurality of first mask patterns disposed apart from each other in a first direction and a second direction perpendicular to the first direction, each of the first mask patterns having a rectangular shape extending in width in the first direction and extending in length in the second direction, wherein the length is greater than the width; and a plurality of second mask patterns each having a constant width not larger than a resolution limit, the second mask patterns extending from the first mask patterns in the first direction at ends of the length of the first mask patterns so as to connect the first mask patterns.

2. A photomask according to claim 1, wherein the second mask patterns fulfill a function of restraining an optical proximity effect on the plurality of the patterns transferred to the object for exposure by the agency of the first mask patterns.

3. A photomask according to claim 1, wherein the second mask patterns extend from the first mask patterns substantially not less than 0.05 μm.

4. A photomask according to claim 1, wherein the first mask patterns, disposed so as to be adjacent to each other, are linked together in a staggered format by the respective second mask patterns.

5. A photomask for transferring a plurality of patterns to an object for exposure, formed on a semiconductor substrate, comprising:

a pair of first mask patterns, each having a constant width not larger than a resolution limit, disposed apart from each other, and substantially in parallel with each other, in a first direction and a second direction orthogonal to the first direction; and a plurality of first main mask patterns disposed apart from each other in the first direction and the second direction, each of the first main mask patterns having a rectangular shape extending in width in the first direction and extending in length in the second direction, wherein the length is greater than the width and the first mask patterns extend from the first main mask patterns at ends of the length of the first main mask patterns so as to connect the first main mask patterns.

6. A photomask according to claim 5, wherein the first mask patterns fulfill a function of restraining an optical proximity effect on the patterns transferred to the object for exposure by the agency of the first main mask patterns.

7. A photomask according to claim 5, wherein the shape of the first mask patterns extends from the first mask patterns substantially not less than 0.05 μm.

8. A photomask for transferring a plurality of patterns to an object for exposure, formed on a semiconductor substrate, comprising:

a pair of first mask patterns, each having a first constant width not larger than a resolution limit, disposed apart from each other, and substantially in parallel with each other, in a first direction and a second direction orthogonal to the first direction;

a plurality of first main mask patterns disposed apart from each other in the first direction and the second direction, each of the first main mask patterns having a rectangular shape extending in width in the first direction and extending in length in the second direction, wherein the length is greater than the width and the first mask patterns extend from the first main mask patterns at the ends of the length of the first main mask patterns; and a plurality of second mask patterns extending from the first main mask patterns, each second mask pattern having a second constant width not larger than a the resolution limit, and disposed between the pair of first mask patterns, substantially in parallel with the respective first mask patterns, and apart from the pair of first mask patterns in the first direction.

9. A photomask according to claim 8, wherein the first mask patterns, extend from the first main mask patterns substantially not less than 0.05 μm.

10. A photomask according to claim 8, wherein an extension of the second mask patterns is shorter than the width of the first mask patterns.

11. A photomask according to claim 8, further comprising a plurality of second main mask patterns disposed so as to be apart from the first main mask patterns.

12. A photomask according to claim 8, wherein the first and second mask patterns fulfill a function of restraining an optical proximity effect on the patterns transferred to the object for exposure by the agency of the first main mask patterns.

13. A photomask according to claim 1, wherein the first mask patterns are connected together through the second mask patterns.

14. A photomask according to claim 13, wherein the ends of the length of the first mask patterns are aligned with one of the second mask patterns.

15. A photomask according to claim 13, wherein the ends of the length of the first mask patterns are aligned with one of the second mask patterns through another one of the first mask patterns.

16. A photomask according to claim 5, wherein the first main mask patterns are connected together through the first mask patterns.

17. A photomask according to claim 16, wherein the ends of the length of the first main mask patterns are aligned with one of the first mask patterns.

18. A photomask according to claim 16, wherein the ends of the length of the first main mask patterns are aligned with one of the first mask patterns through another one of the first main mask patterns.

19. The photomask according to claim 1, wherein the second mask patterns have a width and second direction alignment at the ends of the length of the first mask patterns determined so as to generate features on an exposed object that have a rectangular shape corresponding to the plurality of first mask patterns and compensated for exposure proximity effect at ends of the length of the first mask patterns by the width and second direction alignment of the second mask patterns.

* * * * *